(12) United States Patent
Nagano

(10) Patent No.: US 7,041,950 B2
(45) Date of Patent: May 9, 2006

(54) IMAGE SENSING ELEMENT FOR SENSING AN IMAGE FORMED BY AN IMAGE SENSING LENS

(75) Inventor: Akihiko Nagano, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/083,996

(22) Filed: Feb. 25, 2002

(65) Prior Publication Data

US 2002/0125409 A1 Sep. 12, 2002

(30) Foreign Application Priority Data

Feb. 26, 2001 (JP) ........................................ 2001-050906

(51) Int. Cl.
*G02B 27/40* (2006.01)

(52) U.S. Cl. ................. 250/201.2; 250/208.1; 250/208.6; 348/350; 396/100; 396/115

(58) Field of Classification Search ............. 250/201.4, 250/201.7, 214 R, 208.6, 214 P, 201.2, 201.3, 250/201.6, 201.8; 396/111, 100, 120, 234, 396/115, 121; 348/315, 349, 297, 221.1, 348/224.1, 227.1, 229.1, 350; 356/222, 233

See application file for complete search history.

(56) References Cited

U.S. PATENT DOCUMENTS

| | | | | | |
|---|---|---|---|---|---|
| 4,185,191 | A | * | 1/1980 | Stauffer | 250/204 |
| 4,410,804 | A | * | 10/1983 | Stauffer | 250/208.2 |
| 4,562,346 | A | * | 12/1985 | Hayashi et al. | 250/201.7 |
| 5,245,173 | A | * | 9/1993 | Yamana et al. | 250/201.3 |
| 5,751,354 | A | * | 5/1998 | Suzuki et al. | 348/349 |
| 6,195,509 | B1 | * | 2/2001 | Nakahara | 396/100 |

FOREIGN PATENT DOCUMENTS

| | | |
|---|---|---|
| JP | A55-111928 | 8/1980 |
| JP | A58-24105 | 2/1983 |
| JP | A59-099407 | 6/1984 |
| JP | B5-61610 | 2/1991 |
| JP | A5-127074 | 5/1993 |
| JP | A9-005619 | 1/1997 |
| JP | A2000-171846 | 6/2000 |
| JP | A2000-305010 | 11/2000 |
| JP | A2000-330002 | 11/2000 |
| JP | A2001-033687 | 2/2001 |

OTHER PUBLICATIONS

English Abstract of JPA55–111928.
A cover page of EP0069938 providing an Abstract in English which corresponds to JPA58–24105.
English Abstract of JPA5–127074.
English Abstract of JPA3–033708 which corresponds to JPB5–61610.
English Abstract of JPA2000–171846.
U.S. Appl. No. 09/698,241 by Yasuo Suda filed on Oct. 30, 2000 (unpublished).

* cited by examiner

*Primary Examiner*—David Porta
*Assistant Examiner*—Stephen Yam
(74) *Attorney, Agent, or Firm*—Morgan & Finnegan, L.L.P.

(57) ABSTRACT

This invention realizes high-precision exposure regardless of the F-number of an image sensing lens in photography. One pixel includes a first light-receiving region (119c) which includes a region where the principal ray of an image sensing lens is incident, and second light-receiving regions (119a, 119b) which do not include the region where the principal ray of the image sensing lens is incident. The first light-receiving region (119c) is sandwiched between the two second light-receiving regions (119a, 119b).

24 Claims, 17 Drawing Sheets

IMAGE SENSING ELEMENT FOR SENSING AN IMAGE FORMED BY AN IMAGE SENSING LENS

FIELD OF THE INVENTION

The present invention relates to an image sensing element, image sensing apparatus, and information processing apparatus and, more particularly, to an image sensing element suitable for performing pupil division focus detection upon receiving a beam having passed through the pupil of, e.g., an image sensing lens, a camera having the image sensing element, and an information processing apparatus.

BACKGROUND OF THE INVENTION

There are several focus detection methods for cameras. Japanese Patent Laid-Open Nos. 55-111928 and 58-24105 disclose apparatuses for performing pupil division focus detection by using a two-dimensional sensor in which microlenses are formed on the respective pixels of the sensor.

Canon Inc. has proposed in Japanese Patent Laid-Open No. 2001-124984 an apparatus for performing pupil division focus detection by using an image sensor (image sensing element) used in a digital still camera.

FIG. 12 is a view for explaining the principle of a method of performing pupil division focus detection by using an image sensor, which is disclosed in Japanese Patent Laid-Open No. 2001-124984. An image sensor 10 is arranged on the prospective imaging plane of an image sensing lens 5. One pixel of the image sensor 10 is made up of two light-receiving portions 13a and 13b. The light-receiving portions 13a and 13b are so arranged as to be almost conjugate to the pupil of the image sensing lens 5 through a microlens 11 formed on the image sensing lens side.

The light-receiving portion 13a receives a beam having passed through a predetermined lower region of the image sensing lens 5 in FIG. 12. The light-receiving portion 13b receives a beam having passed through a predetermined upper region of the image sensing lens 5 in FIG. 12. In detecting the focus, signals from the light-receiving portions 13a and 13b of pixels are independently read out. These signals form two images of beams having passed through different positions on the pupil of the image sensing lens 5. Japanese Patent Laid-Open No. 5-127074 discloses a method of detecting a focus by using two images generated by beams having passed through different regions on the pupil of an image sensing lens. The image sensor disclosed in Japanese Patent Laid-Open No. 2001-124984 outputs the sum of an output from the light-receiving portion 13a of one pixel and an output from its light-receiving portion 13b in general photography.

Japanese Patent Publication No. 5-61610 discloses a method of controlling exposure of a focus detection sensor in detecting a focus. To monitor the light quantity incident on the focus detection sensor, the focus detection sensor of this reference has monitoring pixels which are interposed between pixels for generating a focus detection image and monitor the light quantity incident on the sensor. Outputs from the monitoring pixels control the accumulation time of the focus detection pixel and the like.

The image sensor for performing pupil division focus detection is constituted such that a light-receiving portion in one pixel of the image sensor is divided into two regions. The light-receiving sensitivity is low in the region between these light-receiving portions.

FIGS. 13A and 13B are views showing a beam incident on one pixel of the image sensor in general photography. In FIGS. 13A and 13B, reference numerals 13a and 13b denote two divided light-receiving portions. The light-receiving sensitivity is low in the region between these light-receiving portions. The dotted circuit in FIG. 13A is an incident beam when the stop of the image sensing lens is in a full aperture state. When the stop is in a full aperture state, a beam incident on the low-sensitivity region is less than beams incident on the light-receiving portions 13a and 13b. The degree of decrease in image sensor output is small, hardly influencing exposure control.

If the stop of the image sensing lens is stopped down, the ratio of a beam incident on the low-sensitivity region to beams incident on the light-receiving portions 13a and 13b increases, as shown in FIG. 13B. The degree of decrease in image sensor output increases. When photometry is done with the image sensing lens being in a full aperture state and the stop of the image sensing lens is stopped down in accordance with the photometry result, the image sensor output decreases more than the stopping-down effect.

The light-receiving portion of the image sensor and the pupil of the image sensing lens are almost conjugate to each other through the microlens. The pupil of the image sensing lens and the light-receiving portion of the sensor have the same relationship as that shown in FIG. 13A on the pupil plane of the image sensing lens. Beams incident on the light-receiving portions 13a and 13b of the image sensor have a semicircular pupil shape (portion where the pupil (circle represented by the dotted line) of the image sensing lens and the light-receiving portions (rectangles represented by solid lines) overlap each other). This shape is different between the light-receiving portions 13a and 13b (mirror image relationship).

FIG. 14 shows the image sensor outputs of one white line image generated by the light-receiving portions 13a and 13b of the image sensor. An image a in FIG. 14 is an image formed by outputs from the light-receiving portions 13a of pixels. An image b in FIG. 14 is an image formed by outputs from the light-receiving portions 13b of pixels. In this image sensor, the similarity between the two images a and b is low. Even correlation calculation using the two images produces a calculation result error, generating a focus detection error.

To detect the focus state of the image sensing lens, monitoring pixels for determining the charge accumulation time of the pixels and the like are desirably arranged near pixels for acquiring a focus detection image, and a high-contrast focus detection image is desirably acquired. However, the above image sensor does not incorporate any monitoring pixels for determining the charge accumulation time of the pixels and the like in order to detect the focus state of the image sensing lens. In the image sensor, the accumulation time and the like are controlled based on an output from a separate photometry sensor. A high-contrast image is not always obtained.

SUMMARY OF THE INVENTION

The present invention has been made in consideration of the above situation, and has as its object to realize high-precision exposure control regardless of the F-number of an image sensing lens in photography.

It is a secondary object of the present invention to enable increasing coincidence between two images subjected to correlation calculation in focus detection and increasing the focus detection precision.

It is another secondary object of the present invention to allow obtaining an image sensed under a proper exposure as an image subjected to correlation calculation in focus detection.

The first aspect of the present invention relates to an image sensing element for sensing an image formed by an image sensing lens, comprising a pixel which includes a first light-receiving region that includes a region where a principal ray having passed through the image sensing lens is incident, and a second light-receiving region that does not include the region where the principal ray having passed through the image sensing lens is incident.

According to a preferred aspect of the present invention, the second light-receiving region preferably includes two divided light-receiving regions, and the two divided light-receiving regions are preferably so arranged as to sandwich the first light-receiving region. The two divided light-receiving regions are suitable to at least detect a focus state of the image sensing lens, or suitable to detect a focus state of the image sensing lens and photograph an object. The first light-receiving region is suitable to determine a time during which charges are accumulated in the second light-receiving region.

According to another preferred aspect of the present invention, it is preferable that one of the two divided light-receiving regions receives a beam from one of two predetermined regions on a pupil of the image sensing lens and the other of the two divided light-receiving regions receives a beam from the other of the two predetermined regions on the pupil of the image sensing lens, the two predetermined regions being regions that sandwich an optical axis.

According to still another preferred aspect of the present invention, the image sensing element preferably further comprises a function of individually outputting charges accumulated in the first light-receiving region and charges accumulated in the two divided light-receiving regions, and a function of outputting a sum of charges accumulated in the first light-receiving region and charges accumulated in the two divided light-receiving regions.

According to still another preferred aspect of the present invention, an interval between the two divided light-receiving regions is preferably relatively narrow at a center of the first light-receiving region and relatively wide at two ends of the first light-receiving region. Alternatively, the first light-receiving region is preferably relatively narrow at a center and relatively wide at two ends. Alternatively, the first light-receiving region is preferably narrower than a width of each of the two divided light-receiving regions at a center, and wider than the width of each of the two divided light-receiving regions at two ends.

According to still another preferred aspect of the present invention, the pixel preferably has an axially symmetrical structure.

According to still another preferred aspect of the present invention, a region formed from the first and second light-receiving regions preferably has a substantially regular polygonal shape. Alternatively, a region formed from the first and second light-receiving regions preferably has a shape substantially obtained by cutting off each corner of a square.

According to still another preferred aspect of the present invention, the image sensing element preferably further comprises a microlens which causes two divided light-receiving regions to respectively receive beams from two predetermined regions on a pupil of the image sensing lens, the two predetermined regions being regions that sandwich an optical axis.

According to still another preferred aspect of the present invention, the second light-receiving region is preferably used to at least detect a focus state of the image sensing lens.

According to still another preferred aspect of the present invention, the second light-receiving region is preferably used to detect a focus state of the image sensing lens and photograph an object.

According to still another preferred aspect of the present invention, the first light-receiving region is preferably used to determine a time during which charges are accumulated in the second light-receiving region.

According to still another preferred aspect of the present invention, the image sensing element preferably further comprises a microlens on a region formed from the first and second light-receiving regions.

The second aspect of the present invention relates to an image sensing apparatus comprising any one of the above-described image sensing elements, and a control unit for detecting a focus state of the image sensing lens by using the second light-receiving region of the image sensing element, and performing focus adjustment.

This image sensing apparatus can be implemented as, e.g., a digital still camera, a digital video camera, a hybrid device of these cameras, or a camera having another function in addition to the functions of these cameras.

According to still another preferred aspect of the present invention, the control unit preferably controls photographing operation so as to photograph an object by using the second light-receiving region.

According to still another preferred aspect of the present invention, the control unit preferably determines, by using the first light-receiving region, a time during which charges are accumulated in the second light-receiving region.

According to still another preferred aspect of the present invention, the control unit preferably controls a time during which charges are accumulated in the second light-receiving region, in accordance with an exposure amount of the first light-receiving region of the image sensing element in focus adjustment.

According to still another preferred aspect of the present invention, the control unit preferably individually reads out charges accumulated in the first light-receiving region and charges accumulated in the second light-receiving region in focus adjustment, and reads out a sum of charges accumulated in the first light-receiving region and charges accumulated in the two divided light-receiving regions in photography.

The third aspect of the present invention relates to an information processing apparatus comprising the above-described image sensing element or image sensing apparatus. The information processing apparatus can be implemented as, e.g., a portable terminal such as a portable telephone or portable computer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 1:
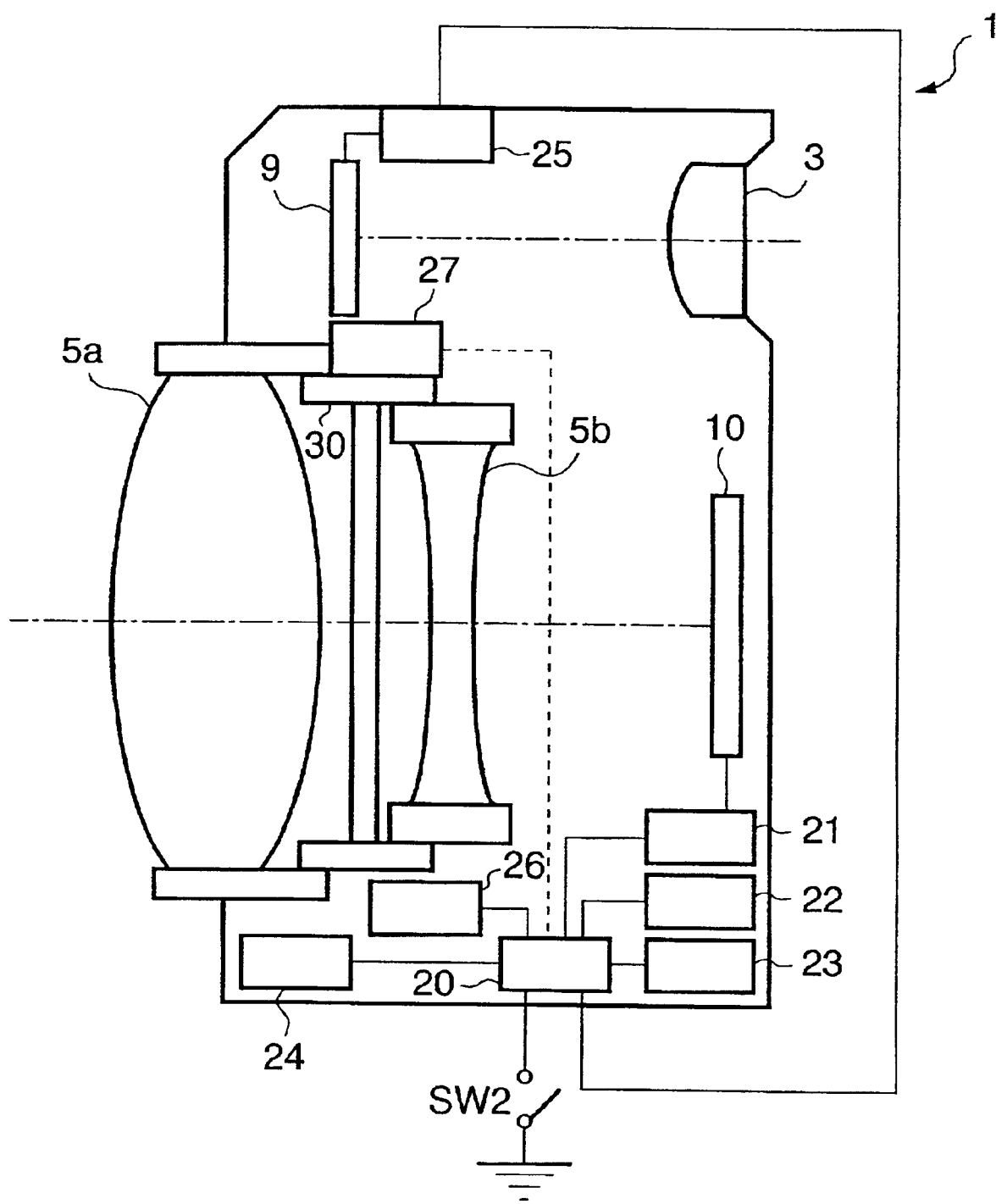
FIG. 1 is a view showing the structure of a camera according to a preferred embodiment of the present invention.
Figure 2:
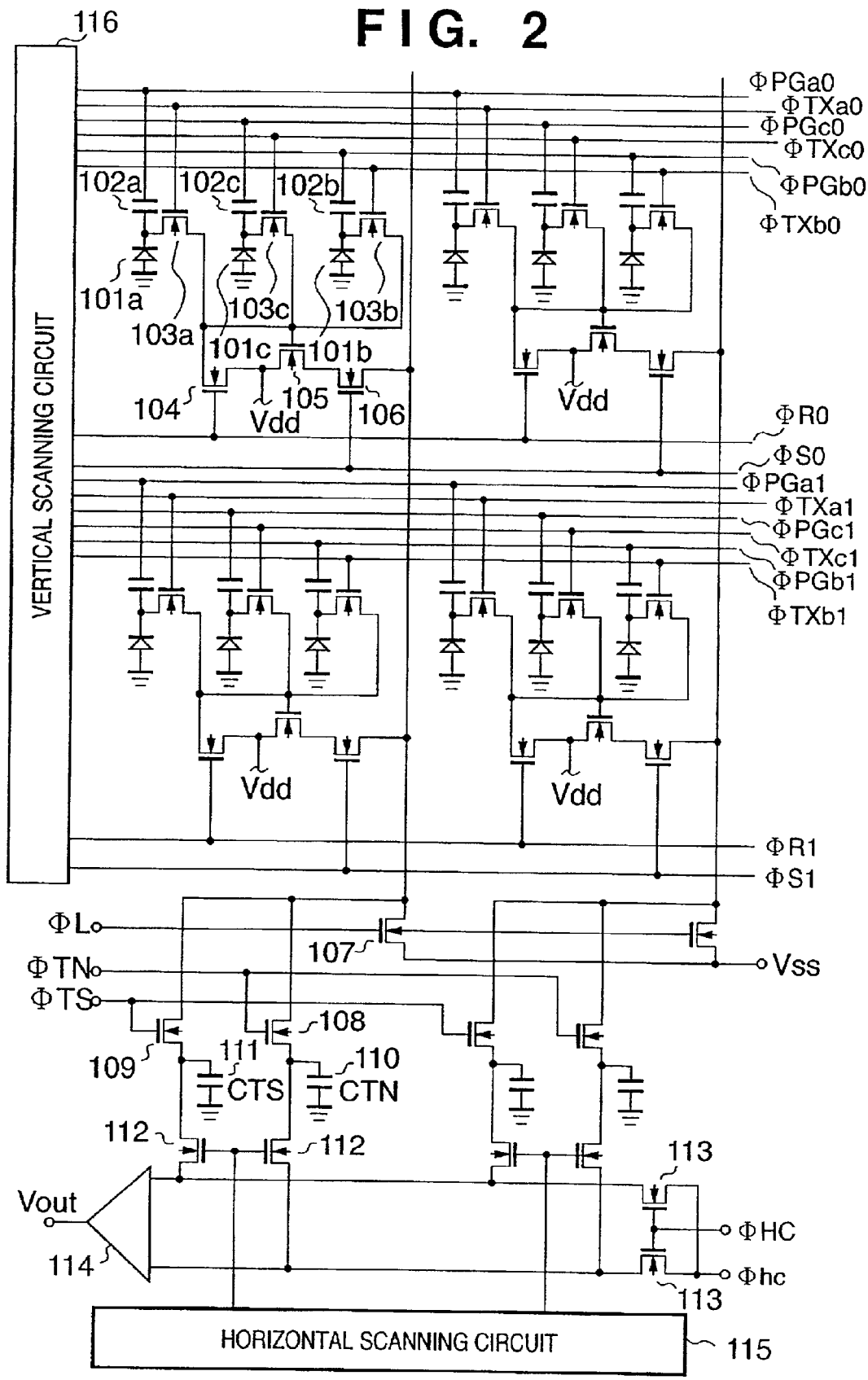
FIG. 2 is a circuit diagram showing an image sensor according to the preferred embodiment of the present invention.
Figure 3:
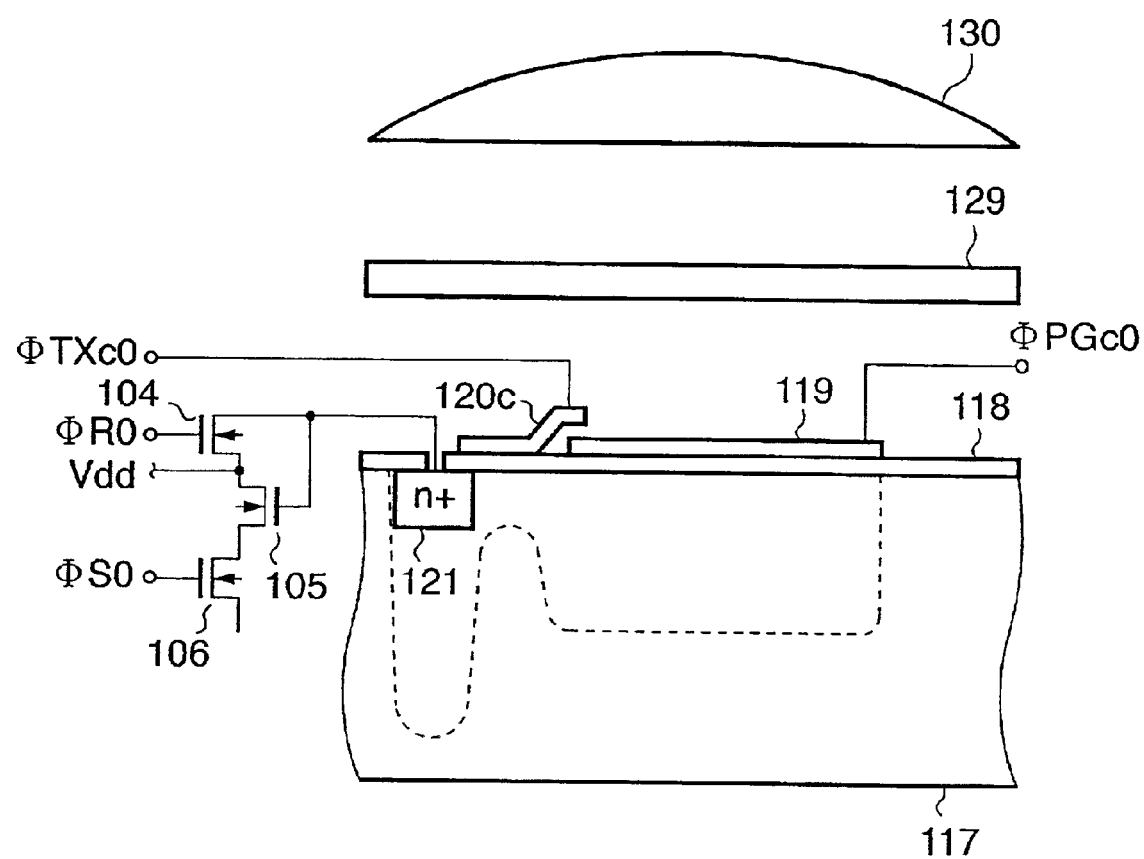
FIG. 3 is a sectional view showing the image sensor according to the preferred embodiment of the present invention.
Figure 4:
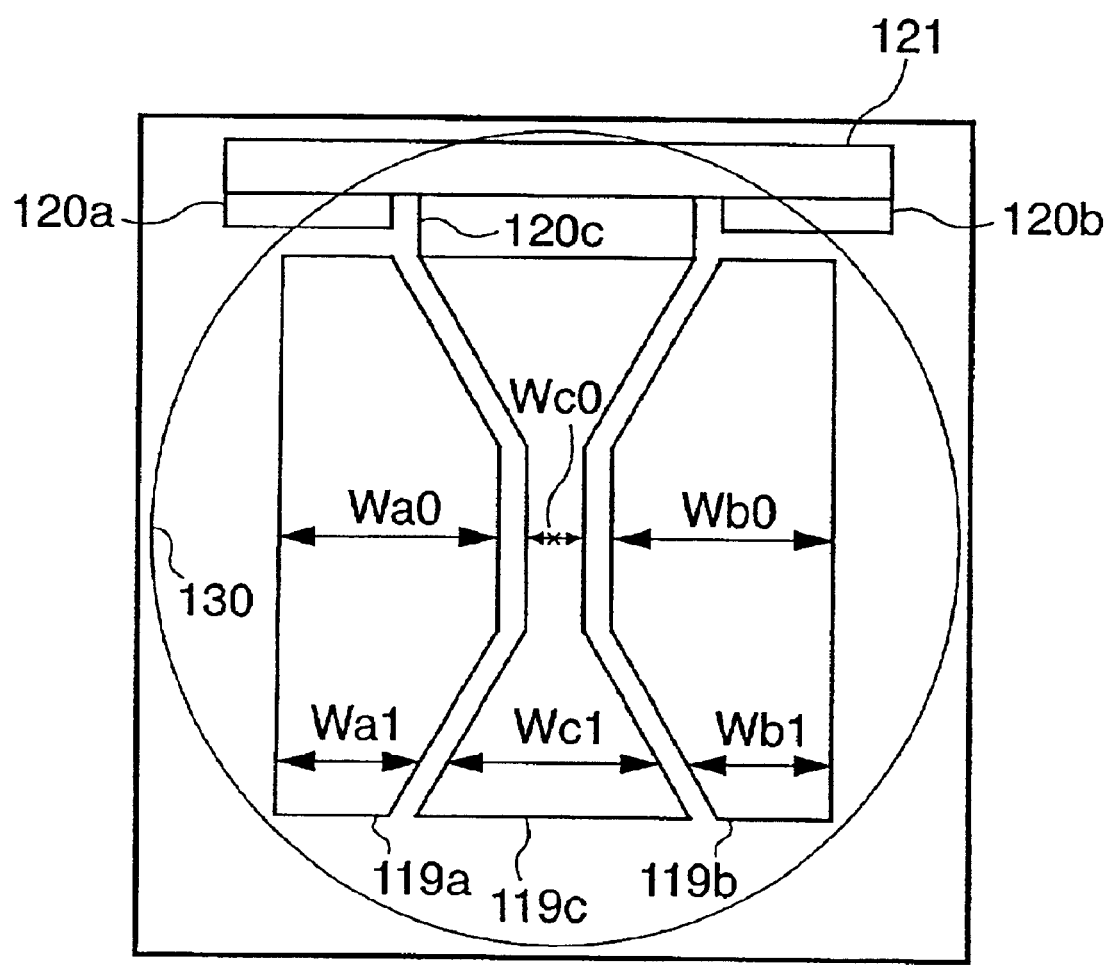
FIG. 4 is a plan view showing the image sensor according to the preferred embodiment of the present invention.
Figure 5:
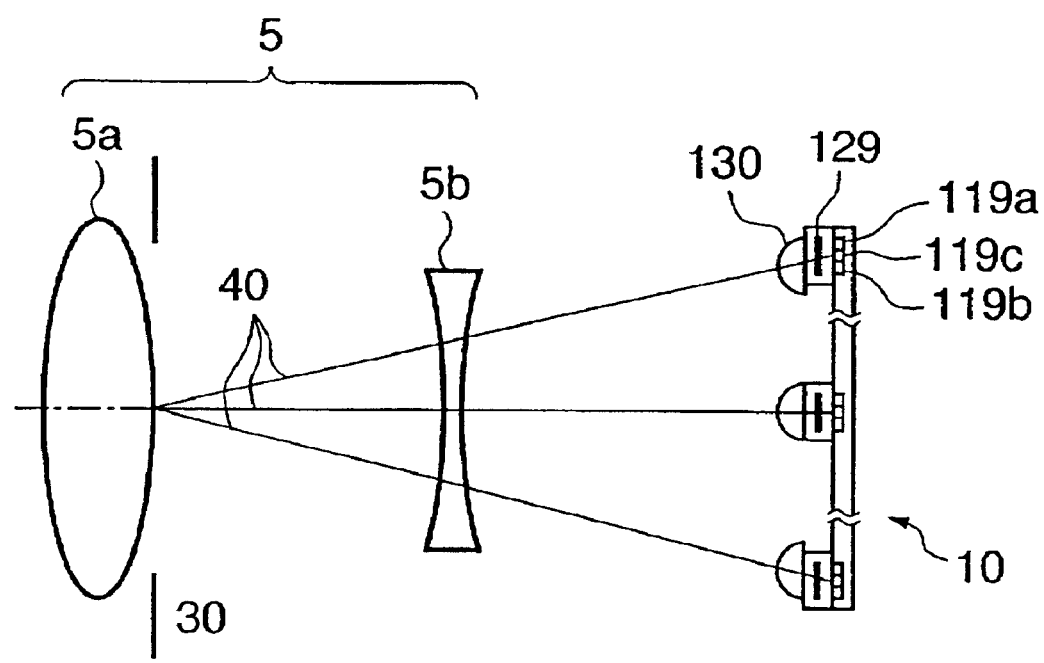
FIG. 5 is a schematic view showing a photographing optical system according to the preferred embodiment of the present invention.
Figure 6A:
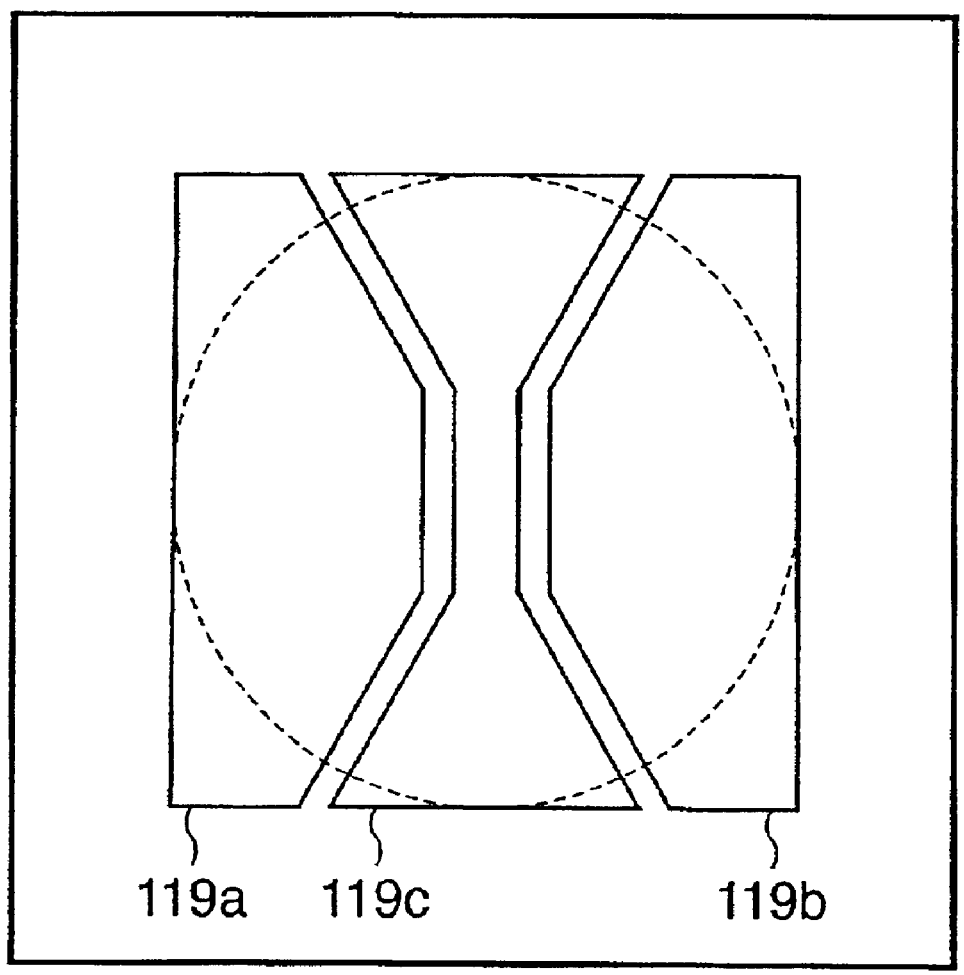
FIGS. 6A and 6B are plan views showing the image sensor according to the preferred embodiment of the present invention.
Figure 6B:
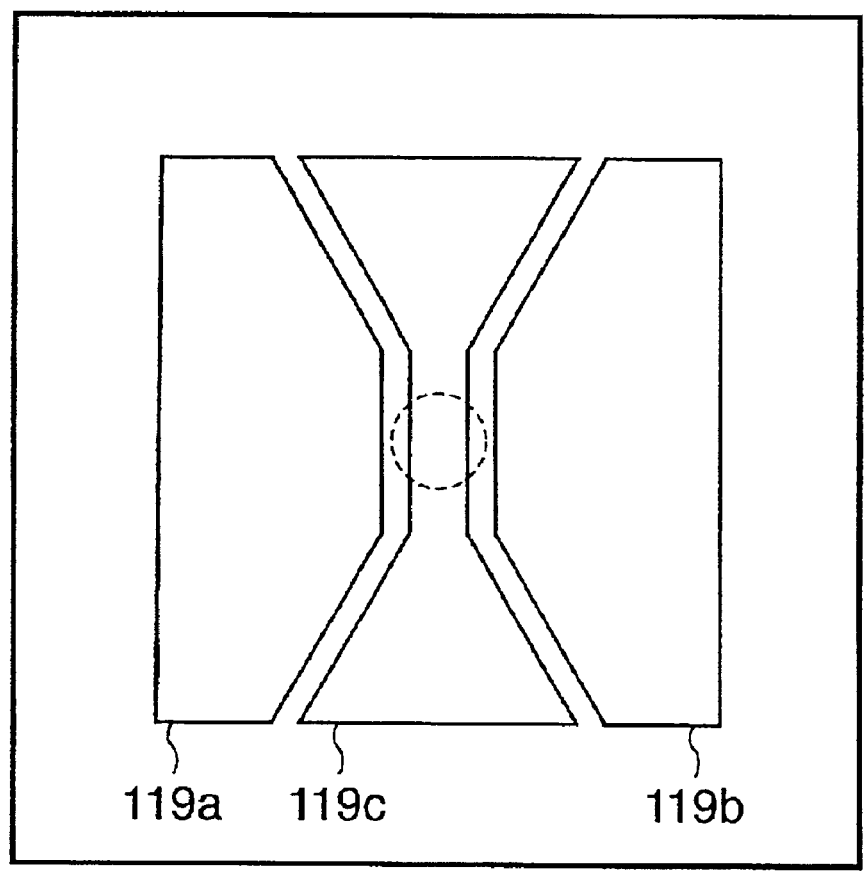
Figure 7:
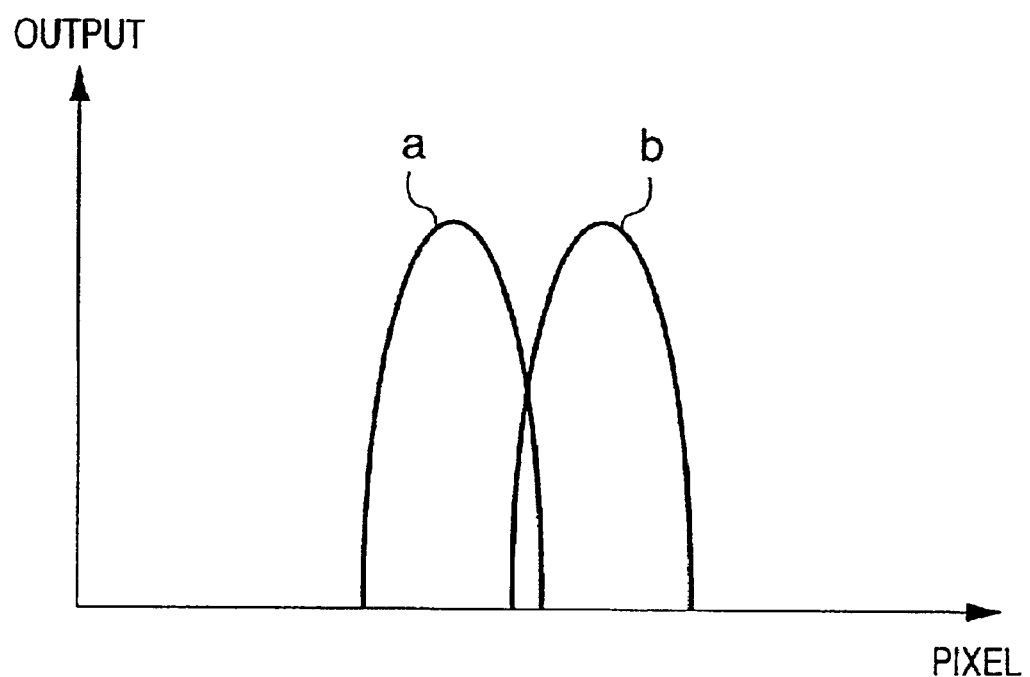
FIG. 7 is a graph showing an image sensor output according to the preferred embodiment of the present invention.
Figure 8A:
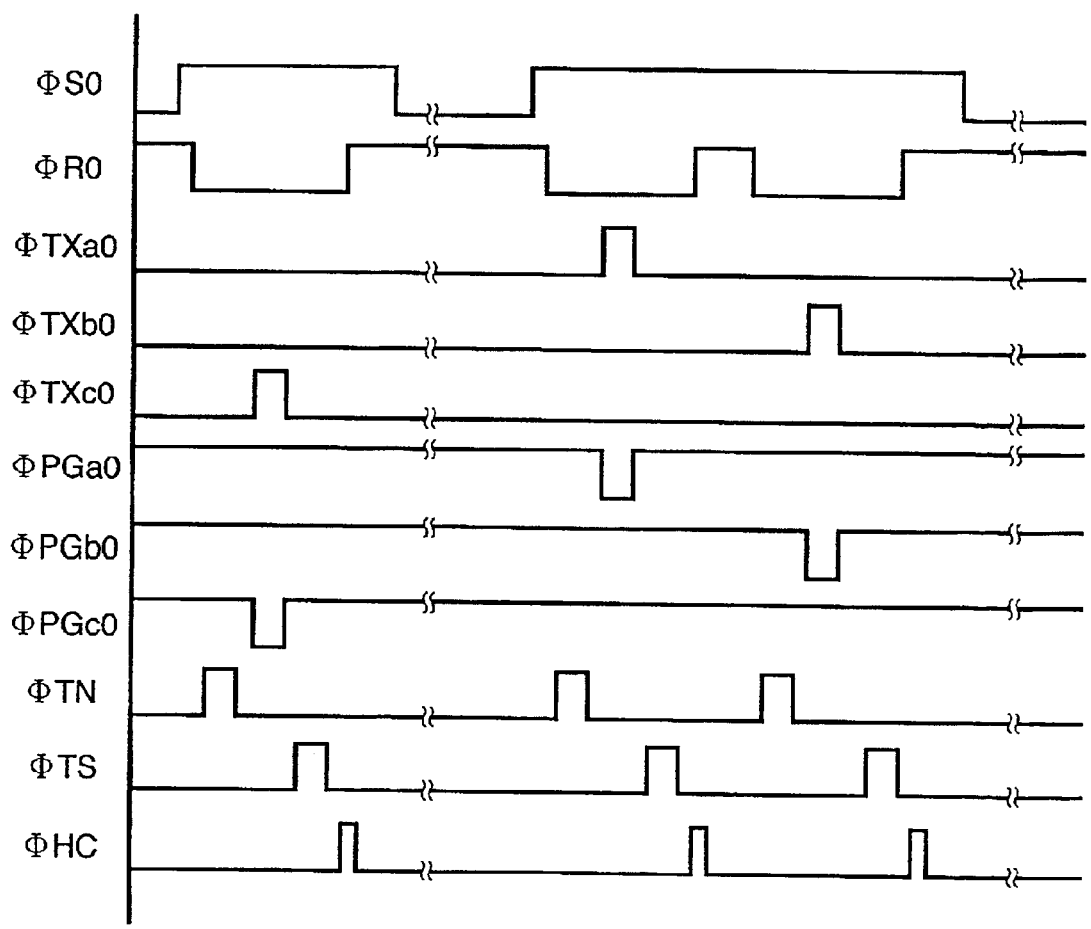
FIGS. 8A and 8B are timing charts of the image sensor according to the preferred embodiment of the present invention.
Figure 8B:
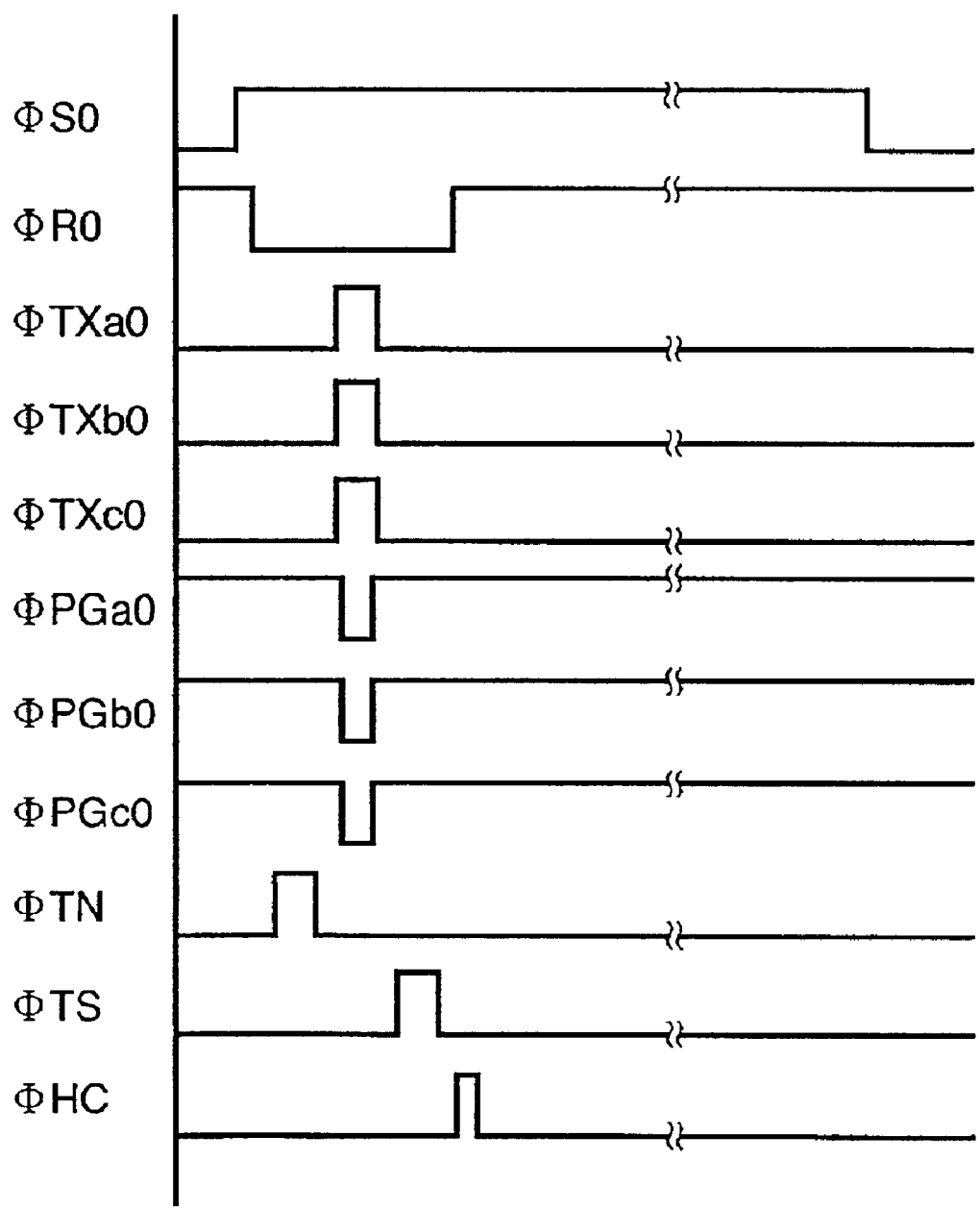
Figure 9:
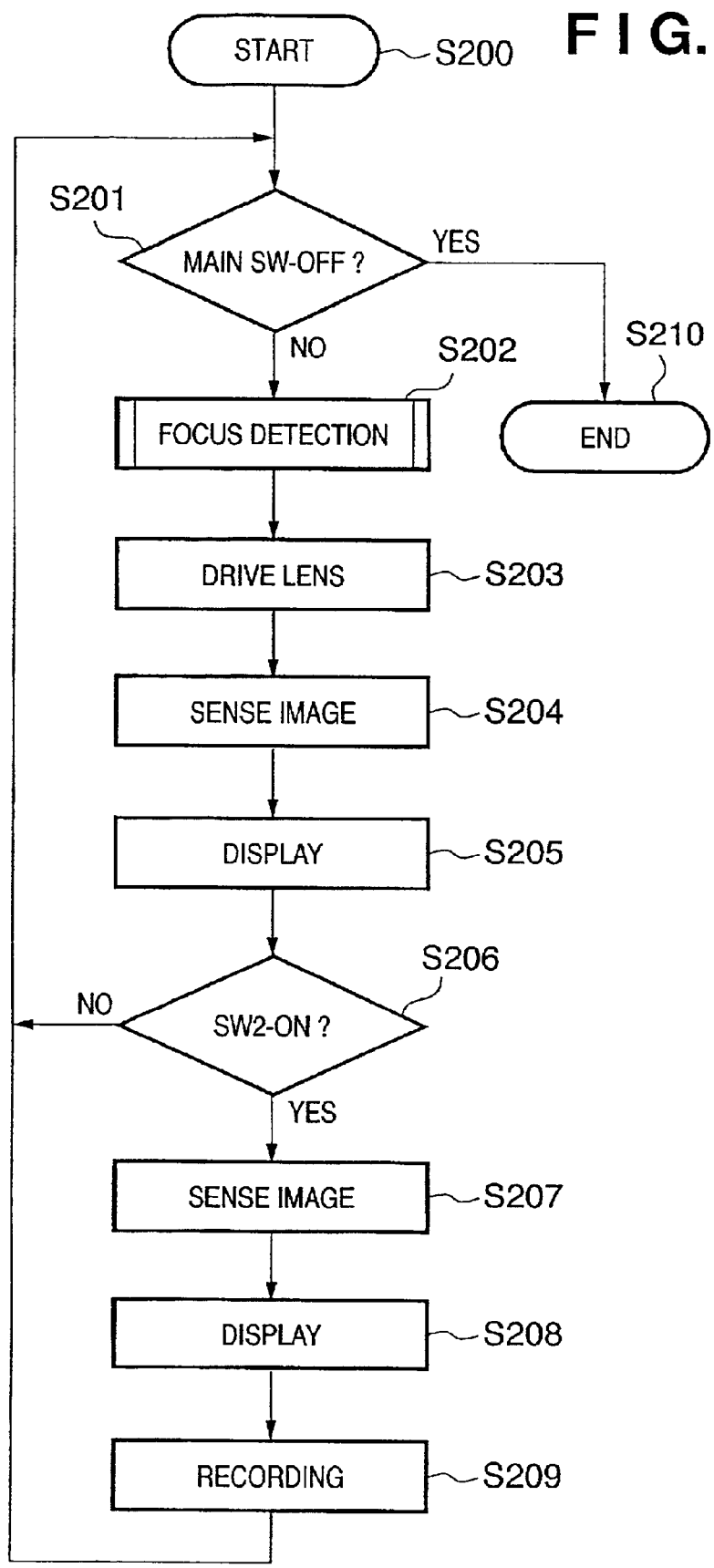
FIG. 9 is a flow chart showing the operation of the camera according to the preferred embodiment of the present invention.
Figure 10:
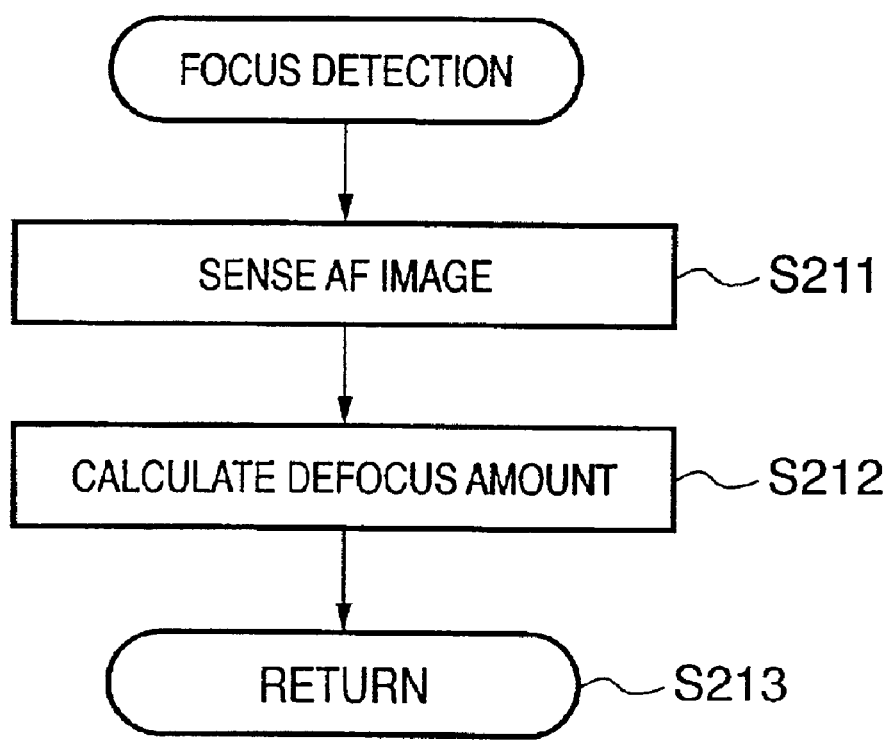
FIG. 10 is a flow chart showing focus detection operation of the camera according to the preferred embodiment of the present invention.
Figure 11:
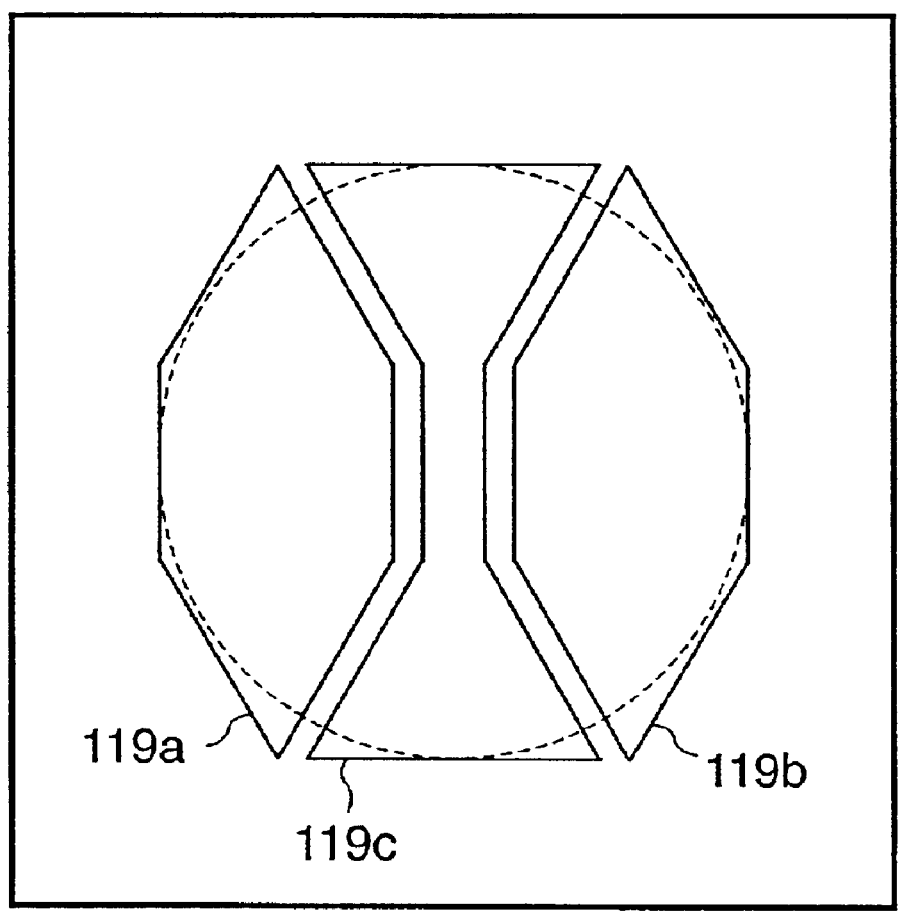
FIG. 11 is a plan view showing the image sensor according to the preferred embodiment of the present invention.
Figure 12:
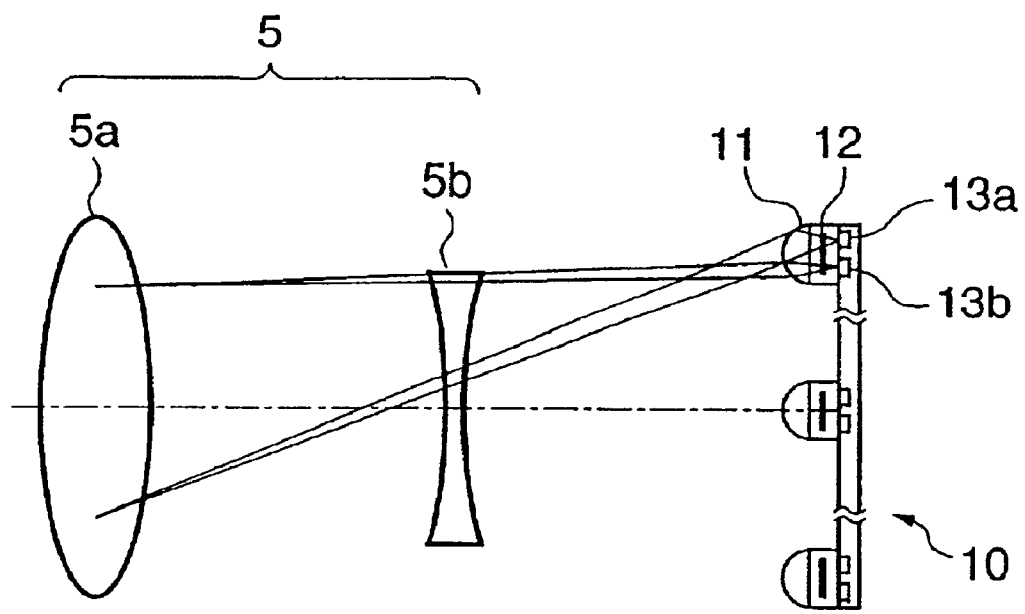
FIG. 12 is a view for explaining the focus detection principle.
Figure 13A:
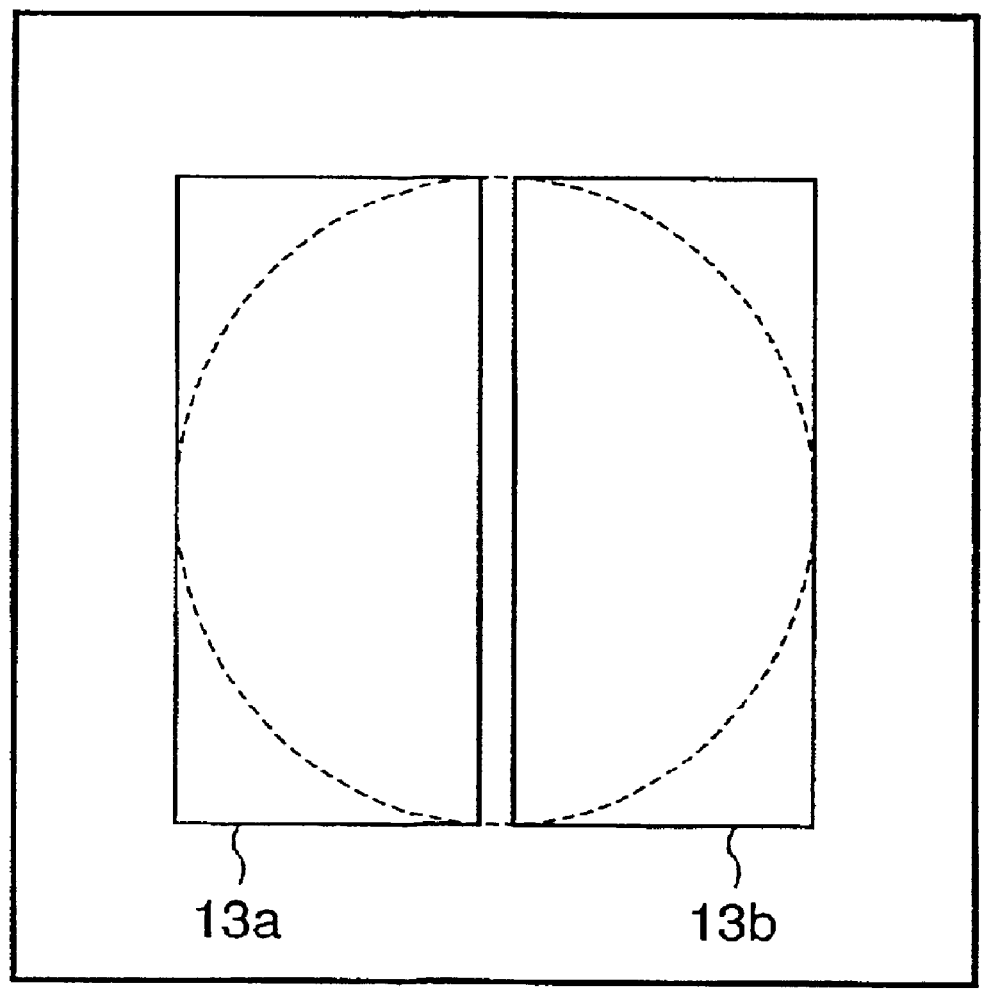
FIGS. 13A and 13B are plan views showing an image sensor.
Figure 13B:
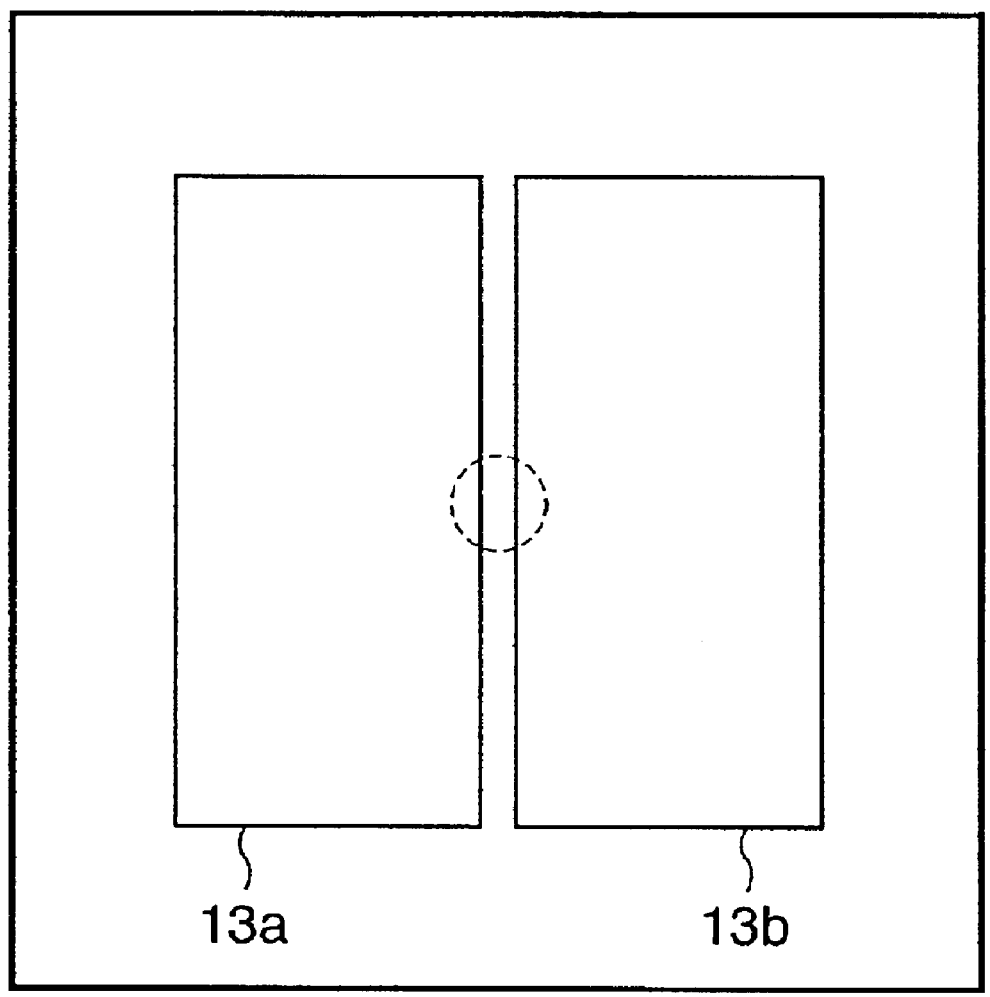
Figure 14:
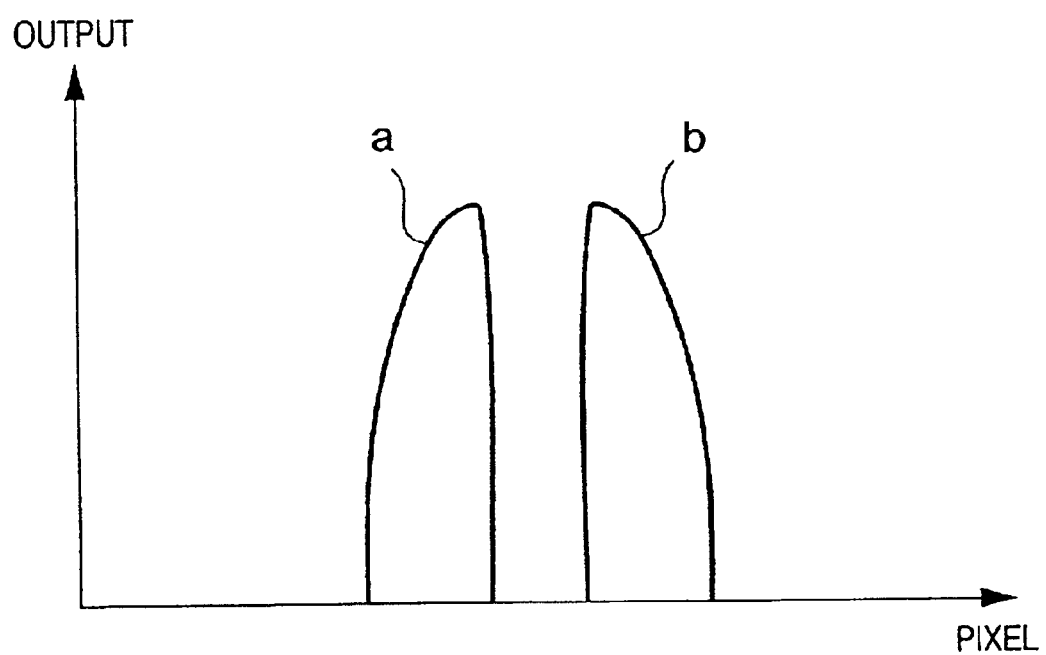
FIG. 14 is a graph showing an image sensor output.

FIGS. 1 to 11 are views showing the preferred embodiment of the present invention. FIG. 1 is a view showing the structure of a digital still camera having an image sensing element (to also be referred to as an image sensor hereinafter) according to the preferred embodiment of the present invention. FIG. 2 is a circuit diagram showing the image sensor. FIG. 3 is a sectional view showing one pixel of the image sensor. FIGS. 4, 6A, and 6B are plan views showing one pixel of the image sensor. FIG. 5 is a schematic view showing a photographing optical system. FIG. 7 is a graph for explaining an image sensor output. FIGS. 8A and 8B are timing charts. FIG. 9 is a flow chart for explaining the operation of the digital still camera. FIG. 10 is a flow chart showing focus detection operation. FIG. 11 is a plan view showing the image sensor.

In FIG. 1, reference numeral 10 denotes an image sensor according to the preferred embodiment of the present invention. The image sensor 10 is arranged on the prospective imaging plane of an image sensing lens 5 (5a, 5b) of a digital still camera 1. The digital still camera 1 comprises a CPU 20 for controlling the overall camera, an image sensor control circuit 21 for driving and controlling the image sensor 10, an image processing circuit 24 for processing an image signal sensed by the image sensor 10, a liquid crystal display element 9 for displaying a sensed image, a liquid crystal display element driving circuit 25 for driving the liquid crystal display element 9, an eyepiece lens 3 for allowing the photographer to observe an object image displayed on the liquid crystal display element 9, a memory circuit 22 for recording an image sensed by the image sensor 10, an interface circuit 23 for outputting an image processed by the image processing circuit 24 outside the camera, and a manipulation switch SW2 for allowing the photographer to designate recording of a photographed image. The memory circuit 22 also records unique information of the image sensing lens.

The image sensing lens 5 has the two lenses 5a and 5b in FIG. 1 for convenience. The image sensing lens 5 is typically comprised of many lenses. The image sensing lens 5 is adjusted to an in-focus state by an image sensing lens driving mechanism 26 on the basis of focus adjustment information sent from the CPU 20. Reference numeral 30 denotes a stop device which is stopped down to a predetermined F-number by a stop driving mechanism 27.

FIG. 2 is a schematic circuit diagram showing the image sensor 10 according to the preferred embodiment of the present invention. FIG. 2 shows a two-dimensional area sensor with 2×2 pixels for convenience. In practice, the image sensor 10 is made up of several million pixels.

In FIG. 2, reference numerals 101a, 101b, and 101c denote photoelectric conversion portions of photoelectric conversion elements each formed from a MOS transistor gate and a depletion layer below the gate; 102a, 102b, and 102c, photogates; 103a, 103b, and 103c, MOS transistors serving as transfer switches; 104, a resetting MOS transistor; 105, a MOS transistor serving as a source follower amplifier; 106, a MOS transistor serving as a horizontal selection switch; 107, a load MOS transistor by source follower connection; 108, a MOS transistor for transferring a dark output; 109, a MOS transistor for transferring a bright output; 110, a capacitor CTN for accumulating dark outputs; 111, a capacitor CTS for accumulating bright outputs; 112, a horizontal transfer MOS transistor; 113, a MOS transistor for resetting a horizontal output line; 114, a differential output amplifier; 115, a horizontal scanning circuit; and 116, a vertical scanning circuit. These components constitute the image sensor control circuit 21 in FIG. 1.

FIG. 3 is a sectional view showing a pixel portion. In FIG. 3, reference numeral 117 denotes a P-well; 118, an $SiO_2$ film serving as the gate insulating film of the MOS; 119, a poly-Si electrode serving as a photogate electrode; 120, a transfer gate for transferring photocharges accumulated below the photogate electrode to a floating diffusion portion (to also be referred to as an FD portion hereinafter) 121; 129, a color filter; and 130, a microlens. The microlens 130 is formed with a shape at a position that makes the pupil of the image sensing lens 5 and the photoelectric conversion portion of the image sensor 10 be almost conjugate to each other.

FIG. 4 is a plan view showing one pixel of the image sensor 10. One pixel of the image sensor 10 has three light-receiving regions 119a, 119b, and 119c segmented by poly-Si electrodes. Transfer gates 120a, 120b, and 120c are respectively arranged at the ends of the light-receiving portions, and can transfer photocharges generated in these light-receiving regions to the FD portion 121. The region between the light-receiving regions 119a and 119c and the region between the light-receiving regions 119b and 119c are so constructed as to attain low light-receiving sensitivities. A circuit in FIG. 4 represents the region where the microlens 130 is formed.

FIG. 5 is a schematic view showing the photographing optical system of the digital still camera 1 according to the preferred embodiment of the present invention. FIG. 5 shows a principal ray 40 incident on each pixel of the image sensor 10. The principal ray 40 is a beam having passed through the center of the aperture of the stop device 30. Each pixel of the image sensor 10 is constructed such that the principal ray 40 passes through the microlens 130 and color filter 129 and then reaches the light-receiving region 119c of each pixel.

FIGS. 6A and 6B are views showing a beam incident on one pixel of the image sensor 10. The microlens 130 on the image sensor 10 is formed with a shape at a position that makes the pupil of the image sensing lens 5 and the photoelectric conversion portion of the image sensor 10 be almost conjugate to each other. A beam having almost the same shape as the stop shape formed by the stop device 30 of the image sensing lens 5 enters the pixel of the image sensor 10. In general photography, the transfer gates 120a, 120b, and 120c shown in FIG. 4 operate to add outputs corresponding to beams incident on the three light-receiving regions 119a, 119b, and 119c, outputting the sum outside the sensor.

The dotted circle in FIG. 6A represents an incident beam when the stop of the image sensing lens 5 is in a full aperture state. When the stop device 30 is in a full aperture state, a beam incident on the low-sensitivity region is less than beams incident on the light-receiving portions 119a, 119b, and 119c. The degree of decrease in sensor output is small, rarely influencing exposure control.

If the stop of the stop device 30 of the image sensing lens 5 is stopped down, most of the incident beam enters the light-receiving region 119c positioned at the center of one pixel, as shown in FIG. 6B. The ratio of a beam incident on the low-sensitivity region is low. Hence, the degree of decrease in sensor output is small, hardly influencing exposure control.

In this manner, the light-receiving region within each pixel is divided into the first light-receiving region 119c which receives a beam containing a principal ray out of photographing beams having passed through the stop device 30 of the image sensing lens 5, and the second light-receiving regions 119a and 119b which receive beams not containing any principal ray. Accurate exposure control can be executed even if the stop of the image sensing lens 5 is stopped down.

In focus detection, the stop of the stop device 30 of the image sensing lens 5 is set to a full aperture state. A beam incident on one pixel of the image sensor 10 obtains a dotted shape in FIG. 6A. On one pixel of the image sensor 10, the central light-receiving region 119c including a position (x in FIG. 4) where the principal ray of a photographing beam is incident on is sandwiched between the two light-receiving regions 119a and 119b, as shown in FIG. 4. At the center of each pixel, a width Wc0 of the light-receiving region 119c is set smaller than widths Wa0 and Wb0 of the two light-receiving regions 119a and 119b. At the end (peripheral portion) of each pixel, a width Wc1 of the light-receiving region 119c is set larger than widths Wa1 and Wb1 of the two light-receiving regions 119a and 119b. As a result, a beam incident on the light-receiving region 119a is almost symmetrical to a beam incident on the light-receiving region 119b.

FIG. 7 shows images generated by the light-receiving regions 119a and 119b of pixels on the image sensor 10 when, e.g., one white line is sensed in focus detection. An image a generated by the light-receiving regions 119a of pixels and an image b generated by the light-receiving regions 119b of pixels are similar to each other. Thus, correlation calculation using the two images yields a high-precision result. Outputs from the light-receiving regions 119a and 119b are separately output by individually operating the transfer gates 120a and 120b.

The operation of the image sensor 10 will be explained with reference to the timing charts of FIGS. 8A and 8B.

FIGS. 8A and 8B are timing charts for the 0th line when the image sensor 10 detects a focus. The focus state of the image sensing lens 5 is detected by conducting correlation calculation between two images obtained by outputs from the light-receiving regions 119a and 119b, and calculating the shift amount (phase difference) between the two images. To obtain a high-contrast image, the accumulation times of the light-receiving regions 119a and 119b are set based on an output from the light-receiving region 119c.

In FIG. 8A, a monitoring output is obtained from the light-receiving region 119c in order to determine the accumulation times of the light-receiving regions 119a and 119b. The vertical scanning circuit 116 changes a control pulse $\Phi L$ to high level at a predetermined timing to reset a vertical output line. The vertical scanning circuit 116 changes a control pulse $\Phi R0$ to high level to turn on the resetting MOS transistor 104, removing residual electrons from the FD portion 121. The vertical scanning circuit 116 changes control pulses $\Phi PGa0$, $\Phi PGb0$, and $\Phi PGc0$ to high level to set the poly-Si electrodes 119a, 119b, and 119c of the photogates 102a, 102b, and 102c to high level. Light having passed through the microlens 130, color filter 129, and photogate electrode 119 generates electron-hole pairs in the dotted depletion layer of the P-well 117. When an electric field of a positive pulse is applied by the control pulses $\Phi PGa0$, $\Phi PGb0$, and $\Phi PGc0$, holes move toward the P-well, and electrons move to below the poly-Si electrode 119. Photocharges corresponding to the amount of electrons generated in accordance with the incident light quantity are accumulated below the poly-Si electrode 119.

The vertical scanning circuit 116 changes a control pulse $\Phi S0$ to high level to turn on the horizontal selection switch MOS transistor 106, thereby selecting the pixel portion of the 0th line. The vertical scanning circuit 116 changes the control pulse $\Phi R0$ to low level to stop resetting of the FD portion 121. Accordingly, the FD portion 121 changes to a floating state, and the MOS transistor 105 operates as a source follower amplifier. After a predetermined time, a control pulse $\Phi TN$ is changed to high level to output the dark voltage of the FD portion 121 to the accumulation capacitor CTN 110 by source follower operation.

To obtain a monitoring output from the light-receiving region 119c of each pixel on the 0th line, the vertical scanning circuit 116 changes a control pulse $\Phi TXc0$ to high level to turn on the transfer switch MOS transistor 103c. After a predetermined time, the vertical scanning circuit 116 changes the control pulse $\Phi PGc0$ to low level. At this time, the potential spread below the photogate 102c (photogate electrode 119) increases, and photoinduced carriers are transferred to the FD portion 121. Since charges from the photoelectric conversion portion 101c of the photodiode are transferred to the FD portion 121, the potential of the FD portion 121 changes in accordance with the light quantity. The MOS transistor 105 as a source follower amplifier is in a floating state. A control pulse $\Phi TS$ is changed to high level to output the potential of the FD portion 121 to the accumulation capacitor CTS 111. At this time, dark outputs and optical outputs from pixels on a predetermined line are respectively accumulated in the accumulation capacitors CTN 110 and CTS 111. A control pulse $\Phi HC$ is temporarily changed to high level to turn on the horizontal output line resetting MOS transistor 113, thereby resetting a horizontal output line. In the horizontal transfer period, the horizontal scanning circuit 115 outputs a scanning timing signal to the horizontal transfer MOS transistor 112 to output dark outputs and optical outputs from pixels to the horizontal output line. At this time, a differential output Vout between the accumulation capacitors CTN 110 and CTS 111 is output from the differential output amplifier 114. A high-S/N signal free from any random noise or fixed-pattern noise of a pixel can be obtained.

The horizontal scanning circuit 115 sequentially outputs scanning timing signals to the horizontal transfer MOS transistors 112 of respective pixels to obtain monitoring outputs from the pixels.

To perform focus detection over a plurality of lines, the vertical scanning circuit 116 starts to obtain monitoring outputs from pixels on the next line.

After monitoring outputs from a predetermined line subjected to focus detection are obtained, signals are read out from the light-receiving regions 119a and 119b of respective pixels for the accumulation time corresponding to the monitoring outputs. In this embodiment, the CPU 20 weights monitoring outputs from the light-receiving regions 119c of respective pixels on the same line. The CPU 20 calculates an appropriate accumulation time of this line in accordance with the weighting result. The CPU 20 controls the vertical scanning circuit 116 and horizontal scanning circuit 115 serving as image sensor control circuits so as to make the accumulation times of pixels equal to each other on the same line.

The vertical scanning circuit 116 changes the control pulse ΦL to high level to reset a vertical output line at a timing corresponding to the set accumulation time. The vertical scanning circuit 116 changes the control pulse ΦR0 to high level to turn on the resetting MOS transistor 104, removing residual electrons from the FD portion 121.

The vertical scanning circuit 116 changes the control pulse ΦS0 to high level to turn on the horizontal selection switch MOS transistor 106, selecting the pixel portion of the 0th line. The vertical scanning circuit 116 changes the control pulse ΦR0 to low level to stop resetting of the FD portion 121. Accordingly, the FD portion 121 changes to a floating state, and the MOS transistor 105 operates as a source follower amplifier. After a predetermined time, the control pulse ΦTN is changed to high level to output the dark voltage of the FD portion 121 to the accumulation capacitor CTN 110 by source follower operation.

To obtain an output from the light-receiving region 119a of each pixel on the 0th line, the vertical scanning circuit 116 changes a control pulse ΦTXa0 to high level to turn on the transfer switch MOS transistor 103c. After a predetermined time, the vertical scanning circuit 116 changes the control pulse ΦPGa0 to low level. At this time, the potential well spread below the photogate 102a (photogate electrode 119) increases, and photoinduced carriers are transferred to the FD portion 121. Since charges from the photoelectric conversion portion 101a of the photodiode are transferred to the FD portion 121, the potential of the FD portion 121 changes in accordance with the light quantity. The MOS transistor 105 as a source follower amplifier is in a floating state. The control pulse ΦTS is changed to high level to output the potential of the FD portion 121 to the accumulation capacitor CTS 111. At this time, dark outputs and optical outputs from pixels on a predetermined line are respectively accumulated in the accumulation capacitors CTN 110 and CTS 111. The control pulse ΦHC is temporarily changed to high level to turn on the horizontal output line resetting MOS transistor 113, thereby resetting a horizontal output line. In the horizontal transfer period, the horizontal scanning circuit 115 outputs a scanning timing signal to the horizontal transfer MOS transistor 112 to output dark outputs and optical outputs from pixels to the horizontal output line. At this time, the differential output Vout between the accumulation capacitors CTN 110 and CTS 111 is output from the differential output amplifier 114. A high-S/N signal free from any random noise or fixed-pattern noise of a pixel can be obtained.

Subsequently, an output from the light-receiving region 119b is obtained by the same process.

Focus detection outputs are attained from respective pixels by sequentially supplying scanning timing signals to the horizontal transfer MOS transistors of the pixels from the horizontal scanning circuit 115. FIG. 7 shows outputs from the light-receiving regions 119a and 119b on a predetermined line. This embodiment properly controls the accumulation times of the focus detection light-receiving regions 119a and 119b on the basis of a monitoring output from the light-receiving region 119c sandwiched between the focus detection light-receiving regions 119a and 119b. A high-contrast image can be obtained as a focus detection image, resulting in high focus detection precision.

FIG. 8B is a timing chart for the 0th line when the image sensor 10 performs general image sensing. In general image sensing, photocharges generated in the light-receiving regions 119a, 119b, and 119c are added at their common FD portion 121, and the sum is output outside the image sensor 10.

In FIG. 8B, the vertical scanning circuit 116 changes the control pulse ΦL to high level at a predetermined timing to reset a vertical output line. The vertical scanning circuit 116 changes the control pulse ΦR0 to high level to turn on the resetting MOS transistor 104, removing residual electrons from the FD portion 121. The vertical scanning circuit 116 changes the control pulses ΦPGa0, ΦPGb0, and ΦPGc0 to high level to set the poly-Si electrodes 119a, 119b, and 119c (represented by the poly-Si electrode 119 in FIG. 3 for illustrative convenience, but in practice the poly-Si electrodes 119a, 119b, and 119c are formed in correspondence with the photogates 102a, 102b, and 102c) of the photogates 102a, 102b, and 102c to high level. Light having passed through the microlens 130, color filter 129, and photogate electrode 119 generates electron-hole pairs in the dotted depletion layer of the P-well 117. When an electric field of a positive pulse is applied by the control pulses ΦPGa0, ΦPGb0, and ΦPGc0, holes move toward the P-well, and electrons move to below the poly-Si electrode 119. Photocharges corresponding to the amount of electrons generated in accordance with the incident light quantity are accumulated below the poly-Si electrode 119.

The vertical scanning circuit 116 changes the control pulse ΦS0 to high level to turn on the horizontal selection switch MOS transistor 106, thereby selecting the pixel portion of the 0th line. The vertical scanning circuit 116 changes the control pulse ΦR0 to low level to stop resetting of the FD portion 121. Accordingly, the FD portion 121 changes to a floating state, and the MOS transistor 105 operates as a source follower amplifier. After a predetermined time, the control pulse ΦTN is changed to high level to output the dark voltage of the FD portion 121 to the accumulation capacitor CTN 110 by source follower operation.

To obtain outputs from the light-receiving regions 119a, 119b, and 119c of each pixel on the 0th line, the vertical scanning circuit 116 changes the control pulses ΦTXa0, ΦTXb0, and ΦTXc0 to high level to turn on the transfer switch MOS transistors 103a, 103b, and 103c. After a predetermined time, the vertical scanning circuit 116 changes the control pulses ΦPGa0, ΦPGb0, and ΦPGc0 to low level. At this time, the potential spread below the photogates 102a, 102b, and 102c increases, and photoinduced carriers are transferred to the FD portion 121. Since charges from the photoelectric conversion portions 102a, 102b, and 102c of the photodiode are transferred to the FD portion 121, the potential of the FD portion 121 changes in accordance with the light quantity. The source follower amplifier MOS transistor 105 is in a floating state. The control pulse ΦTS is changed to high level to output the potential of the FD portion 121 to the accumulation capacitor CTS 111. At this time, dark outputs and optical outputs from pixels on a predetermined line are respectively accumulated in the accumulation capacitors CTN 110 and CTS 111. The control pulse ΦHC is temporarily changed to high level to turn on the horizontal output line resetting MOS transistor 113, thereby resetting a horizontal output line. In the horizontal transfer period, the horizontal scanning circuit 115 outputs a scanning timing signal to the horizontal transfer MOS transistor 112 to output dark outputs and optical outputs from pixels to the horizontal output line. At this time, the differential output Vout between the accumulation capacitors CTN 110 and CTS 111 is output from the differential output amplifier 114. A high-S/N signal free from any random noise or fixed-pattern noise of a pixel can be obtained.

The horizontal scanning circuit 115 sequentially outputs scanning timing signals to the horizontal transfer MOS transistors of respective pixels to obtain outputs from the pixels. Outputs from all the pixels of the image sensor 10 can be similarly obtained under the control of the vertical scanning circuit 116 and horizontal scanning circuit 115.

The operation flow of a camera having the image sensing element (image sensor) according to the preferred embodiment of the present invention will be described with reference to FIG. 9.

If the photographer turns on the main switch (not shown) of the digital still camera 1 (S200), the CPU 20 for controlling the overall camera executes focus detection of the image sensing lens 5 (S202). The flow of focus detection calculation will be explained with reference to FIG. 10.

The CPU 20 of the camera main body 1 sends an image sensing start signal for focus detection to the image sensor control circuit 21 to cause the image sensor 10 to sense a focus detection beam (S211).

The image sensor control circuit 21 A/D-converts an output from a light-receiving portion for condensing a beam having passed through one predetermined region on the pupil of the image sensing lens 5, out of the light-receiving portions of the image sensor 10 arranged on the prospective imaging plane of the image sensing lens 5. The converted signal is output to the CPU 20. Similarly, the image sensor control circuit 21 A/D-converts an output from a light-receiving portion for condensing a beam having passed through the other predetermined region on the pupil of the image sensing lens 5. The converted signal is output to the CPU 20.

From the signals output from the two focus detection light-receiving regions 119a and 119b of each of pixels having identical color filters, the CPU 20 generates an object image by the focus detection beam having passed through one predetermined region on the pupil of the image sensing lens 5, and an object image by the focus detection beam having passed through the other predetermined region on the pupil of the image sensing lens 5. FIG. 7 shows two object images (focus detection signals) obtained by the two focus detection light-receiving regions of each pixel. As shown in FIG. 4, the light-receiving regions 119a and 119b for receiving a focus detection beam on one pixel of the image sensor 10 are wide in the central region of the pixel in FIG. 4, and narrow in the peripheral region of the pixel. A beam incident on the light-receiving region 119a and a beam incident on the light-receiving region 119b are almost symmetrical to each other. Two generated object images exhibit high coincidence in correlation calculation, resulting in high focus detection precision. Even if the divided shape of one pixel of the image sensor 10 is changed into a shape prepared by cutting out the outer corners of the light-receiving regions 119a and 119b in consideration of wiring at the peripheral portion of the pixel, as shown in FIG. 11, the received beam keeps the dotted shape in FIG. 4, not posing any problem.

After two object images are detected, the CPU 20 calculates the correlation by using the two object images. The defocus amount of the image sensing lens 5 is calculated from the image shift amount of each image. Then, the CPU 20 returns to the flow shown in FIG. 9 (S212).

The CPU 20 sends a lens driving signal to the image sensing lens driving mechanism 26. The image sensing lens driving mechanism 26 drives the image sensing lens 5 by an amount corresponding to the defocus amount, and sets it to an in-focus state (S203).

After the image sensing lens 5 is driven to a predetermined position and focus adjustment ends (S203), the CPU 20 of the camera main body 1 sends an image sensing signal to the image sensor control circuit 21 to cause the image sensor 10 to sense an image (S204). At this time, charges generated in the light-receiving regions 119a, 119b, and 119c of the image sensor 10 are added up within the pixel, and the sum is output to the image sensor control circuit 21. An image signal sensed by the image sensor 10 is A/D-converted by the image sensor control circuit 21, and subjected to image processing by the image processing circuit 24. The image signal having undergone image processing is sent to the liquid crystal display element driving circuit 25 via the CPU 20, and displayed on the liquid crystal display element 9 (S205). This allows the photographer to observe the object image displayed on the liquid crystal display element 9 via the eyepiece lens 3.

The CPU 20 checks the state of the manipulation switch SW2 for recording a sensed image (S206). If the photographer does not manipulate the manipulation switch SW2 (NO in S206), the CPU 20 checks the state of the main switch (S201).

If the photographer presses the manipulation switch SW2 in order to photograph the object (YES in S206), the CPU 20 sends an image sensing signal to the image sensor control circuit 21 to cause the image sensor 10 to perform actual image sensing (S207). An image signal A/D-converted by the image sensor control circuit 21 undergoes image processing by the image processing circuit 24. The resultant image signal is sent to the liquid crystal display element driving circuit 25 and displayed on the liquid crystal display element 9 (S208).

At the same time, the CPU 20 directly stores the sensed image signal in the memory circuit 22 of the camera main body 1 (S209).

If photographing operation ends and the photographer turns off the main switch (YES in S201), power supply to the camera stops to change the camera to a standby state (S210).

Focus detection is performed based on outputs from a plurality of lines in the embodiment, but may be done based on an output from one line.

In the embodiment, the accumulation time of the focus detection light-receiving region is determined for each line on the basis of a monitoring output from the line. The accumulation time may be determined commonly for a plurality of lines by averaging monitoring outputs from the lines used for focus detection.

In the embodiment, the vertical and horizontal scanning circuits are arranged as image sensor control circuits outside the image sensor. However, the vertical and horizontal scanning circuits may be incorporated in the image sensor.

All or part of software in the embodiment may be replaced by hardware, or all or part of hardware in the embodiment may be replaced by software.

Either all or part of the apparatus and method according to the embodiment can constitute the present invention.

The apparatus and building components in the embodiment may be practiced as part of another apparatus or by coupling them to anther apparatus.

The present invention can also be applied to various image sensing apparatuses such as a video movie camera, video still camera, interchangeable-lens camera, single-lens reflex camera, lens shutter camera, and monitoring camera, and further to apparatuses including these image sensing apparatuses.

The functions of the embodiment can also be achieved by providing to a system or apparatus a storage medium (or recording medium) which records program codes of predetermined software. The functions of the embodiment can be realized not only when the computer executes the program codes stored in the storage medium, but also when the OS (Operating System) running on the computer performs part or all of actual processing on the basis of the instructions of the program codes. The functions of the embodiment are also realized when the program codes read out from the storage medium are written in the memory of a function expansion board inserted into the computer or the memory of a function expansion unit connected to the computer, and the CPU of the function expansion board or function expansion unit executes part or all of actual processing on the basis of the instructions of the program codes.

The present invention realizes high-precision exposure control regardless of the F-number of an image sensing lens in photography.

The preferred embodiment of the present invention can increase coincidence between two images subjected to correlation calculation in focus detection and increase the focus detection precision.

The preferred embodiment of the present invention can obtain an image sensed under a proper exposure as an image subjected to correlation calculation in focus detection.

As many apparently widely different embodiments of the present invention can be made without departing from the spirit and scope thereof, it is to be understood that the invention is not limited to the specific embodiments thereof except as defined in the claims.

What is claimed is:

1. An image sensing element to be used for an image sensing apparatus having an image sensing lens and a stop, and arranged to sense an image formed by the image sensing lens, the image sensing element comprising:
    a plurality of microlenses; and
    a plurality of light-receiving portions arranged so as to correspond to the respective microlenses,
    wherein each light-receiving portions includes first, second and third light-receiving regions each outputting a signal, the third light-receiving region having first and second end portions and continuously extending from the first end portion to the second end portion along a longitudinal direction of the third light-receiving region, each of the first and second light-receiving regions having substantially symmetrical shape with respect to a line parallel to the longitudinal direction, the first and second light-receiving regions being substantially symmetry with each other and being arranged to sandwich the third light-receiving region, the width of center portions of the first and second light-receiving regions being wider than the width of center portion of the third light-receiving region, and the width of peripheral portions of the first and second light-receiving regions being narrower than the width of the peripheral portions of the third light receiving region.

2. The element according to claim 1, wherein the first and second light-receiving regions are used to at least detect a focus state of the image sensing lens.

3. The element according to claim 1, wherein the first and second light-receiving regions are used to detect a focus state of the image sensing lens and photograph an object.

4. The element according to claim 1, wherein one of the first and second light-receiving regions receives a beam from one of two predetermined regions on a pupil of the image sensing lens and the other of the first and second light-receiving regions receives a beam from the other of the two predetermined regions on the pupil of the image sensing lens, the two predetermined regions being regions that sandwich an optical axis.

5. The element according to claim 1, wherein the third light-receiving region is used to determine a time during which charges are accumulated in the first and second light-receiving regions.

6. The element according to claim 1, further comprising a function of individually outputting charges accumulated in the first, second and third light-receiving regions, and a function of outputting a sum of charges accumulated in the first, second and third light-receiving regions.

7. The element according to claim 1, wherein the third light-receiving region is narrower than a width of each of the first and second light-receiving regions at a center and wider than the width of each of the first and second light-receiving regions at two ends.

8. The element according to claim 1, wherein a region formed from the first, second and third light-receiving regions has a substantially regular polygonal shape.

9. The element according to claim 1, wherein a region formed from the first, second and third light-receiving regions has a shape substantially obtained by cutting off each corner of a square.

10. The element according to claim 1, wherein the microlens is arranged to cause the first and second light-receiving regions to respectively receive beams from two predetermined regions on a pupil of the image sensing lens, the two predetermined regions being regions that sandwich an optical axis.

11. An image sensing apparatus comprising:
    an image sensing element arranged to sense an image formed by an image sensing lens; and
    a control unit arranged to detect a focus state of the image sensing lens, and perform focus adjustment,
    wherein said image sensing element comprises:
        a plurality of microlenses, and
        a plurality of light-receiving portions arranged so as to correspond to the respective microlenses, each light-receiving portion including first, second and third light-receiving regions each outputting a signal, the third light-receiving region having first and second end portions and continuously extending from the first end portion to the second end portion along a longitudinal direction of the third light-receiving region, each of the first and second light-receiving regions having substantially symmetrical shape with respect to a line parallel to the longitudinal direction, the first and second light-receiving regions being substantially symmetry with each other and being arranged to sandwich the third light-receiving region, the width of center portions of the first and second light-receiving regions being wider than the width of center portion of the third light-receiving region, and the width of peripheral portions of the first and second light-receiving regions being narrower than the width of the peripheral portions of the third light receiving region, and wherein said control unit is arranged to detect a focus state of the image sensing lens by using the first and second light-receiving regions.

12. The apparatus according to claim 11, wherein said control unit controls photographing operation so as to photograph an object by using the first and second light-receiving regions.

13. The apparatus according to claim 11, wherein said control unit determines, by using the third light-receiving region, a time during which charges are accumulated in the first and second light-receiving regions.

14. The apparatus according to claim 11, wherein said control unit controls a time during which charges are accumulated in the first and second light-receiving regions, in accordance with an exposure amount of the third light-receiving region in focus adjustment.

15. The apparatus according to claim 11, wherein said control unit individually reads out charges accumulated in the first, second and third light-receiving regions in focus adjustment, and reads out a sum of charges accumulated in the first, second and third light-receiving regions in photography.

16. The apparatus according to claim 11, wherein the first and second light-receiving regions receive beams from two predetermined regions on a pupil of the image sensing lens, the two predetermined regions being regions that sandwich an optical axis.

17. The apparatus according to claim 11, wherein an interval between the first and second light-receiving regions is relatively narrow at a center of the third light-receiving region and relatively wide at two ends of the third light-receiving region.

18. The apparatus according to claim 11, wherein the third light-receiving region is relatively narrow at a center and relatively wide at two ends.

19. The apparatus according to claim 11, wherein the third light-receiving region is narrower than a width of each of the first and second light-receiving regions at a center, and wider than the width of each of the first and second light-receiving regions at two ends.

20. The apparatus according to claim 11, wherein a region formed from the first, second and third light-receiving regions has a substantially regular polygonal shape.

21. The apparatus according to claim 11, wherein a region formed from the first, second and third light-receiving region has a shape substantially obtained by cutting off each corner of a square.

22. An image processing apparatus comprising the image sensing apparatus defined in claim 11.

23. An image sensing element to be used for an image sensing apparatus having an image sensing lens and a stop, and arranged to sense an image formed by the image sensing lens, the image sensing element comprising:

a plurality of microlenses; and a plurality of light-receiving portions arranged so as to correspond to the respective microlenses, wherein each light-receiving portions includes first, second and third light-receiving regions each outputting a signal, the first and second light-receiving regions having substantially symmetrical shape and being arranged to sandwich the third light-receiving region that includes a position where the principal ray of a photographing beam is incident, the width of center portions of the first and second light-receiving regions being wider than the width of center portion of the third light-receiving region, and the width of peripheral portions of the first and second light-receiving regions being narrower than the width of peripheral portion of the third light receiving region.

24. An image sensing apparatus comprising:

an image sensing element arranged to sense an image formed by an image sensing lens; and a control unit arranged to detect a focus state of the image sensing lens, and perform focus adjustment, wherein said image sensing element comprises:
a plurality of microlenses, and
a plurality of light-receiving portions arranged so as to correspond to the respective microlenses, each light-receiving portion including first, second and third light-receiving regions each outputting a signal, the first and second light-receiving regions having substantially symmetrical shape and being arranged to sandwich the third light-receiving region that includes a position where the principal ray of a photographing beam is incident, the width of center portions of the first and second light-receiving regions being wider than the width of center portion of the third light-receiving region, and the width of peripheral portions of the first and second light-receiving regions being narrower than the width of peripheral portion of the third light receiving region, and wherein said control unit is arranged to detect a focus state of the image sensing lens by using the first and second light-receiving regions.

* * * * *

UNITED STATES PATENT AND TRADEMARK OFFICE
CERTIFICATE OF CORRECTION

| | | |
|---|---|---|
| PATENT NO. | : 7,041,950 B2 | Page 1 of 1 |
| APPLICATION NO. | : 10/083996 | |
| DATED | : May 9, 2006 | |
| INVENTOR(S) | : Akihiko Nagano | |

It is certified that error appears in the above-identified patent and that said Letters Patent is hereby corrected as shown below:

On the cover page at item (56) under "FOREIGN PATENT DOCUMENTS", please insert:

--JP  60-189721  9/1985

JP  62-229213  10/1987

JP  63-204236  8/1988--

On the cover page at item (56) under "OTHER PUBLICATIONS", please insert:

--English Abstract of JPA 60-189721

English Abstract of JPA 62-229213

English Abstract of JPA 63-204236

Appeal/Trial Decision dated Aug. 1, 2005 of basic Japanese Appl. No. 2001-050906--.

Signed and Sealed this

Eighth Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,041,950 B2 | Page 1 of 1 |
| APPLICATION NO. | : 10/083996 | |
| DATED | : May 9, 2006 | |
| INVENTOR(S) | : Akihiko Nagano | |

It is certified that error appears in the above-identified patent and that said Letters Patent is hereby corrected as shown below:

On the cover page item (54), correct the Title (54) to read:

-- IMAGE SENSING ELEMENT WITH A PIXEL HAVING AT LEAST TWO LIGHT-RECEIVING REGIONS--.

Signed and Sealed this

Twenty-seventh Day of February, 2007

JON W. DUDAS
*Director of the United States Patent and Trademark Office*